(12) United States Patent
Hayashi et al.

(10) Patent No.: US 9,083,137 B2
(45) Date of Patent: Jul. 14, 2015

(54) OPTICAL COMMUNICATION MODULE

(75) Inventors: Shigeo Hayashi, Yokkaichi (JP); Satoshi Yoshikawa, Yokohama (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 698 days.

(21) Appl. No.: 13/375,989

(22) PCT Filed: May 20, 2010

(86) PCT No.: PCT/JP2010/058504
§ 371 (c)(1),
(2), (4) Date: Dec. 2, 2011

(87) PCT Pub. No.: WO2010/146962
PCT Pub. Date: Dec. 23, 2010

(65) Prior Publication Data
US 2012/0099872 A1     Apr. 26, 2012

(30) Foreign Application Priority Data
Jun. 16, 2009   (JP) ................................ 2009-143601

(51) Int. Cl.
*H04B 10/00*      (2013.01)
*H01S 5/022*     (2006.01)

(52) U.S. Cl.
CPC ... *H01S 5/02248* (2013.01); *H01L 2224/48091* (2013.01); *H01L 2224/48247* (2013.01);
(Continued)

(58) Field of Classification Search
CPC ........ H04B 10/40; H04B 10/43; H04B 10/50; H04B 10/501; H04B 10/60

USPC ......... 398/135, 136, 137, 138, 139, 164, 140, 398/141, 158, 159, 182, 183, 202, 208; 385/88, 89, 90, 92, 93, 14
See application file for complete search history.

(56) References Cited

U.S. PATENT DOCUMENTS 6,130,448 A * 10/2000 Bauer et al. .................... 257/222
6,396,116 B1 * 5/2002 Kelly et al. .................... 257/432
(Continued)

FOREIGN PATENT DOCUMENTS

| JP | A-2002-299652 | 10/2002 |
| JP | A-2003-318419 | 11/2003 |

(Continued)

OTHER PUBLICATIONS

International Search Report dated Jun. 22, 2010 in International Application No. PCT/JP2010/058504.
Office Action issued in German Application No. 112010002553.3 dated May 23, 2013 (with translation).

*Primary Examiner* — Hanh Phan
(74) *Attorney, Agent, or Firm* — Oliff PLC

(57) ABSTRACT

Plural conductive plates extend from a transparent containing unit containing the photoelectric conversion device, plural electrical circuit components are connected to the conductive plate, and the conductive plate extending from the transparent containing unit is accommodated in a housing while the conductive plate is bent. At that time, the conductive plate extending from the transparent containing unit is coupled at two portions in an extending direction by coupled-fixing members made of non-conductive synthetic resin, the electrical circuit components are mounted between the coupled-fixing members and the conductive plate is bent at portions outside these two coupled-fixing members. In the case that the conductive plate must be cut to generate a floating point portion, a floating-point fixing member is provided for coupling and fixing the floating point portion to an adjacent conductive plate.

9 Claims, 6 Drawing Sheets

(52) U.S. Cl.
CPC ............... *H01L2224/48464* (2013.01); *H01L 2224/49171* (2013.01); *H01L 2924/3025* (2013.01); *H01S 5/02284* (2013.01)

(56) References Cited

U.S. PATENT DOCUMENTS

| | | | |
|---|---|---|---|
| 6,550,982 B2 * | 4/2003 | Auburger et al. | ............... 385/88 |
| 7,136,594 B2 * | 11/2006 | Nakanishi et al. | ............ 398/164 |
| 7,268,368 B1 | 9/2007 | Knapp | |
| 7,334,948 B2 | 2/2008 | Sasser et al. | |
| 7,370,414 B2 | 5/2008 | Ice | |
| 7,455,463 B2 | 11/2008 | Togami et al. | |
| 7,539,366 B1 * | 5/2009 | Baks et al. | ....................... 385/14 |
| 2002/0102074 A1 | 8/2002 | Nakura et al. | |
| 2002/0141706 A1 | 10/2002 | Nakura et al. | |
| 2004/0071406 A1 | 4/2004 | Nakura et al. | |
| 2004/0071412 A1 | 4/2004 | Nakura et al. | |
| 2004/0175080 A1 | 9/2004 | Yamauchi et al. | |
| 2007/0003194 A1 | 1/2007 | Ueno et al. | |
| 2007/0058980 A1 | 3/2007 | Hidaka | |
| 2009/0000809 A1 | 1/2009 | Yagisawa et al. | |

FOREIGN PATENT DOCUMENTS

| | | |
|---|---|---|
| JP | A-2004-200331 | 7/2004 |
| JP | A-2004-226433 | 8/2004 |
| JP | A-2005-167189 | 6/2005 |
| JP | A-2006-40976 | 2/2006 |
| JP | A-2007-13040 | 1/2007 |
| JP | A-2007-43496 | 2/2007 |
| JP | A-2007-225635 | 9/2007 |
| JP | A-2008-066362 | 3/2008 |
| JP | A-2008-98389 | 4/2008 |
| JP | A-2008-210962 | 9/2008 |
| JP | A-2009-130278 | 6/2009 |
| WO | WO 01/15348 A1 | 3/2001 |

* cited by examiner

F I G. 4
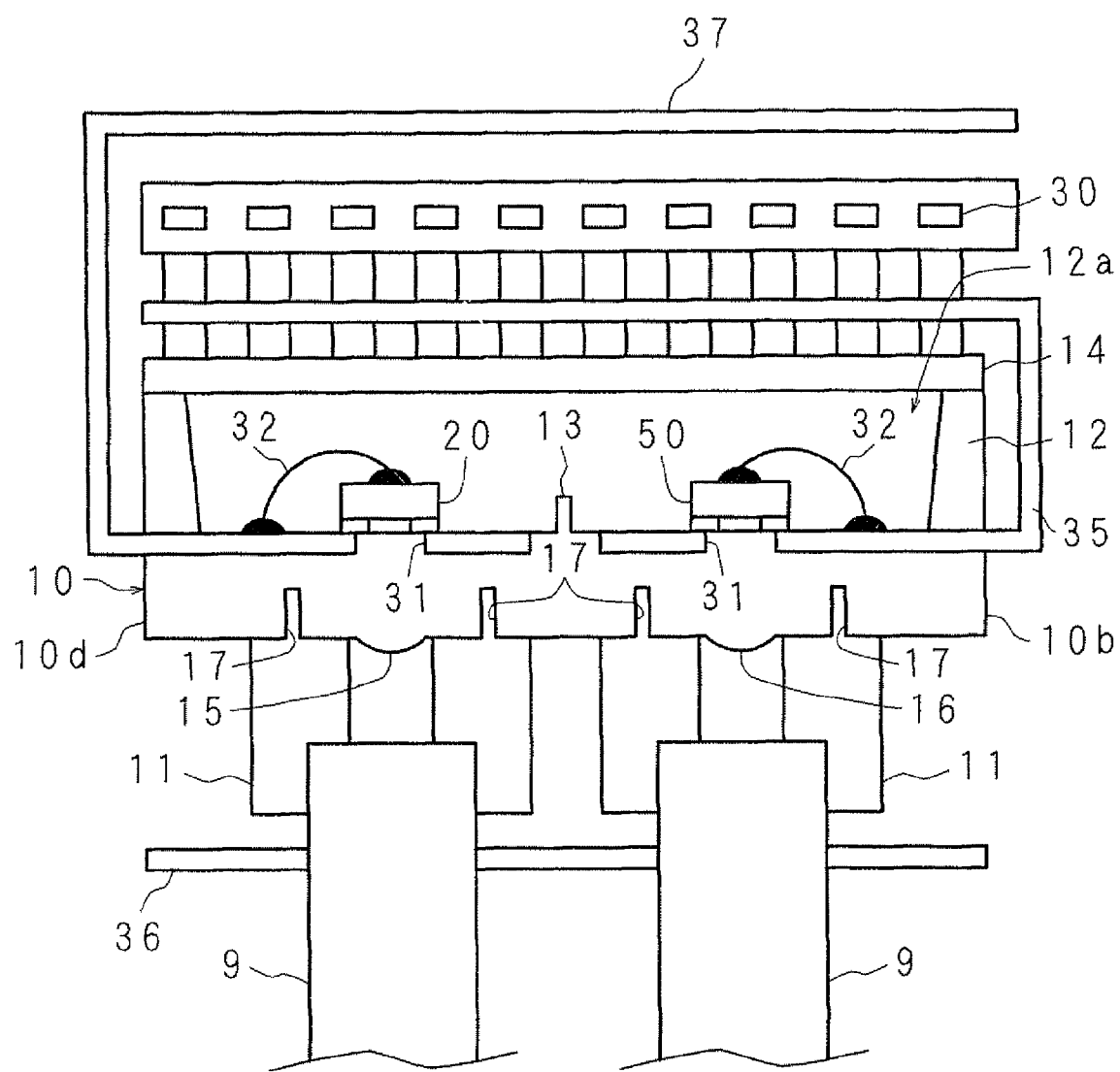

OPTICAL COMMUNICATION MODULE

This application is the national phase under 35 U.S.C. §371 of PCT International Application No. PCT/JP2010/058504 which has an International filing date of May 20, 2010 and designated the United States of America.

BACKGROUND OF THE INVENTION

1. Field of the Invention

The present invention relates to an optical communication module that packages a photoelectric conversion device, such as a laser diode and/or a photodiode for performing optical communication.

2. Description of Related Art

Conventionally, the optical communication has become widespread, which utilizes an optical fiber and the like. The optical communication is performed with a photoelectric conversion device, such as a laser diode, converting an electrical signal into an optical signal. The converted optical signal is transmitted through an optical fiber. Then, another photoelectric conversion device, such as a photodiode, converts the received optical signal into the electrical signal. Thus, a well utilized optical communication module packages photoelectric conversion devices, such as a laser diode and/or a photodiode, together with or without a peripheral circuit for operating the photoelectric conversion devices. Such an optical communication module is called an optical subassembly (OSA).

In the case that a circuit component configuring a peripheral circuit is packaged together with a photoelectric conversion device, for example, it is possible to package a photodiode together with an amplifier circuit that amplifies voltage/current generated in response to the detection performed by the photodiode. In addition, it may be possible to package a laser diode together with a driver circuit that generates voltage/current for making the laser diode emit light. When a peripheral circuit is additionally packaged in an optical communication module as described above, a communication apparatus does not require including such a circuit. Thus, it is possible to reduce the size and the price of the communication apparatus.

Patent Document 1 proposes an optic-electric conversion module that includes: a photoelectric conversion device that transmits or receives an optical signal; a stem that supports the photoelectric conversion device; a cap that covers the photoelectric conversion device; and plural wire leads that apply electrical signals to the photoelectric conversion device or convey electrical signals transmitted from the photoelectric conversion device, wherein a flat member is arranged at one end of a predetermined wire lead located in a package configured with the stem and the cap, an electrical circuit component is mounted on the flat member, one end of the electrical circuit component is connected to the photoelectric conversion device, and the other end of the electrical circuit component is connected to the lead wire, for enhancing the high frequency characteristic and for reducing the size of the module.

Patent Document 2 proposes an optical device module that includes: a first package that contains a light source and/or a light detector, and has a first surface in which an opening portion is formed for passing an optical signal and a second surface opposite to the first surface; a second package in which an opening portion is configured for accommodating an insert, such as a circuit board, and which is perpendicular to the second surface of the first package; and a leadframe that mechanically connects the first package with the second package and electrically connects the light source and/or the light detector of the first package to a connection point exposed inside the opening portion of the second package, wherein the insert, such as a circuit board, is mechanically connected to the second package and electrically connected to the connection point in the opening portion, for making a circuit component mounted on the circuit board and the like actuate the light source and/or the light detector. Furthermore, it is proposed for the optical device module that a lens block holding a lens is fixed to the first package, and the optical fiber is fit to an opening portion formed on the lens block.

Patent Document 3 proposes a method for manufacturing a leadframe connector utilized for connecting an optical subassembly to a printed circuit board (PCB) of an optical communication module. In this method, a shape of a conductive member is marked on a conductive ribbon, a case insulating the conductive member is formed by injection molding process with the open reel system while the conductive member is bent as appropriate, and then the conductive ribbon is cut to manufacture a single type of leadframe connectors. The plural conductive members arranged in one casing can be separated electrically by cutting out the connected area of the plural conductive members through a hole formed on the casing.

Patent Document 4 proposes an optical device module that includes: a first package that contains a light source and/or a light detector, in which an opening portion is formed for passing an optical signal; a second package that accommodates a circuit board; and a leadframe that connects the first package and the second package, wherein the first package and the second package are formed by resin molding method and the like on the same surface of the leadframe, and the optical device module is assembled by connecting the first and second packages thereto through the leadframe that has been bent.

Patent Document 1: Japanese Patent Application Laid-Open No. 2005-167189
Patent Document 2: U.S. Pat. No. 7,455,463
Patent Document 3: U.S. Pat. No. 7,370,414
Patent Document 4: U.S. Pat. No. 7,334,948

SUMMARY OF THE INVENTION

However, the optic-electric conversion module proposed by Patent Document 1 is configured to arrange the electrical circuit component on the flat member formed at one end of the wire lead, and to include plural wire leads. Thus, there are few types of electrical circuit components that can be mounted. Hence, it is difficult to mount an advanced peripheral circuit on this optic-electric conversion module.

The optical device module proposed by Patent Document 2 is configured to connect the second package perpendicular to the first package containing the light source and/or the light detector, to accommodate the circuit board into the opening portion of the second package, and to fix the lens block to the first package. In short, this optical device module is highly complex. Thus, it is not easy to reduce the size of this optical device module. Especially, the circuit board and the second package accommodating the circuit board may become larger. Furthermore, it is difficult to reduce the cost of this optical device module and the procedure for manufacturing this optical device may become complex, because this optical device is configured with many parts. The optical communication module utilizing the leadframe connector proposed by Patent Document 3 is also configured similarly. The optical device module proposed by Patent Document 4 may include a larger circuit board and a larger second package, because the circuit board is similarly accommodated in the second package.

The present invention is made in view of such circumstances, and has an object to provide an optical communication module that can package plural electrical circuit components configuring a peripheral circuit together with the photoelectric conversion device, and facilitate reducing the size and the cost.

An optical communication module according to the present invention comprises: a photoelectric conversion device that performs an opto-electric conversion; a transparent containing unit that contains the photoelectric conversion device and comprises a transparent portion which passes light to the photoelectric conversion device; plural conductive plates that are electrically connected to the photoelectric conversion device inside the transparent containing unit, and extend outside the transparent containing unit; two coupled-fixing members that connect the plural conductive plates with non-conductive material in a direction perpendicular to an extending direction; and one or more electrical circuit components that are connected to the conductive plate at a portion between said two coupled-fixing members.

In addition, an optical communication module according to the present invention further comprises: a floating point generated by cutting two portions of one conductive plate in the extending direction between said two coupled-fixing members; and a floating-point fixing member that connects and fixes the floating point to another conductive plate adjacent to said one conductive plate with non-conductive material.

In addition, an optical communication module according to the present invention comprises: the transparent containing unit that is formed in a polyhedral shape; the plural conductive plates that extend outside from one surface of the transparent containing unit; and a shield board that extends outside from another surface of the transparent containing unit and shields electromagnetic noises.

In addition, an optical communication module according to the present invention comprises the shield board that includes a through hole passing light to the photoelectric conversion device contained in the transparent containing unit.

In addition, an optical communication module according to the present invention further comprises a sealing unit that seals the electrical circuit component connected to the conductive plate with synthetic resin.

In addition, an optical communication module according to the present invention comprises: the transparent containing unit that is formed in a polyhedral shape having at least one surface and another surface opposite to said one surface; and the plural conductive plates that extend outside from said one surface and said another surface of the transparent containing unit, wherein a staggered arrangement is configured by the conductive plates extending from said one surface and the conductive plates extending from said another surface.

In addition, an optical communication module according to the present invention further comprises a housing that accommodates the transparent containing unit containing the photoelectric conversion device, the plural conductive plates connected to the electrical circuit component, and the coupled-fixing member, while the plural conductive plates are bent at portions outside said two coupled-fixing member, wherein extending ends of the plural conductive plates are exposed outside the housing.

According to an aspect of the present invention, it is configured that plural conductive plates extend from the transparent containing unit containing the photoelectric conversion device, and that the electrical circuit component is connected to the extending conductive plate. The conductive plate is electrically connected to the photoelectric conversion device inside the transparent containing unit. Thus, when the conductive plate is utilized as a wire for giving and obtaining electrical signals, it is possible to configure an electrical circuit for performing optical communication by the electrical circuit component connected to the conductive plate and the photoelectric conversion device contained in the transparent containing unit. Hence, the optical communication module can package electrical circuit components required for the peripheral circuit, without including the circuit board. Therefore, it is possible to reduce the number of assembled parts. Furthermore, it is possible to reduce the price and the size easily.

Additionally, in the case that the conductive plate of the optical communication module is made of metal, such as aluminum, and is able to be bent, the conductive plate extending from the transparent containing unit can be processed, e.g., bent along the external surface of the transparent containing unit. Thus, even in the case that the transparent containing unit, the conductive plate and the like are accommodated in a housing, it is possible to reduce the size of the housing and thus reduce the size of the optical communication module. In the case that the optical communication module is mounted on a circuit board of a communication apparatus, it becomes relatively free to decide the mounting position.

In the case that the conductive plate can be bent, the bending process may give a stress on a part connecting the conductive plate and the electrical circuit component, and then a connection fault may be caused. Therefore, the optical communication module according to the present invention is provided with coupled-fixing members at two positions in the extending direction, as the coupled-fixing member couples and fixes the plural conductive plates extending from the transparent containing unit, in the direction perpendicular to the extending direction with the non-conductive material. Furthermore, the optical communication module according to the present invention is provided with the electrical circuit component arranged at a place between two coupled-fixing members. In the case that the conductive plates are configured to be bent, portions of the conductive plates outside two coupled-fixing members are bent. Therefore, it is possible to prevent the stress caused by the bending on the portion connecting the electrical circuit component and the conductive plate arranged at the place between two coupled-fixing members. For example, the resin molding with synthetic resin may be utilized for easily forming the coupled-fixing member.

In the case that the peripheral circuit is configured with electrical circuit components connected to the conductive plate, for example, the electrical circuit components, such as a resistance and a capacitor, are serially connected, it is possible to facilitate connecting the electrical circuit components by cutting two sites of the conductive plate and thus forming a floating point portion. In the case that the floating point portion is formed in the present invention by cutting two sites of one conductive plate, another conductive plate adjacent to said one conductive plate is coupled and fixed with non-conductive material to the floating point portion. For example, the floating-point fixing member fixing the floating point portion may be formed in addition to the coupled-fixing member by the resin molding with synthetic resin. Therefore, it is possible to easily implement the floating point portion and enhance the design freedom of the electrical circuit mounted on the optical communication module.

According to an aspect of the present invention, the transparent containing unit containing the photoelectric conversion device is formed in a polyhedral shape. In the case that the plural conductive plates are configured to extend from one surface of the polyhedral shape, the shield board is configured to extend from another surface from which the conductive plates do not extend. When this shield board is bent to cover the external surface of the transparent containing unit, it is possible to prevent external electromagnetic noises from interrupting the performance of the photoelectric conversion device contained in the transparent containing unit. Therefore, it is possible to prevent the reduction of communication accuracy for the optical communication module.

According to an aspect of the present invention, in the case that the shield board is prepared for preventing the electromagnetic noises, the though hole is formed on the shield board. Therefore, it is possible to pass the light from the outside to the transparent portion of the transparent containing unit through the through hole of the shield board, even when the external surface of the transparent containing unit is covered by the shield board.

According to an aspect of the present invention, the connection strength for the electrical circuit component and the conductive plate is enhanced by sealing with synthetic resin of the electrical circuit component connected to the conductive plate. In the case that an electrical circuit component, such as a packaged integrated circuit (IC) or a resistance, is connected to the conductive plate, it is possible to connect the terminal of the electrical circuit component to the conductive plate by soft solder, conductive adhesive or the like, and to obtain a sufficient connection strength. In the case that an electrical circuit component, such as a semiconductor chip, is connected to the conductive plate by wire bonding method or the like, it is possible to utilize resin sealing and thus to enhance the connection strength. It is also considered that the packaged IC, the resistance or the like are sealed with resin for further enhancing the connection strength.

According to an aspect of the present invention, in the case that the transparent containing unit is formed in a polyhedral shape, it is possible to mount a larger number of electrical circuit components and enhance the design freedom of the electrical circuit mounted on the optical communication module, by configuring plural conductive plates extending from one surface of the transparent containing unit and plural conductive plates extending from the opposite surface of the transparent containing unit.

An extending end of the conductive plate extending from the transparent containing unit can be utilized as a connection terminal in the case that the optical communication module is mounted on a circuit board of a communication apparatus. In the case that plural conductive plates are extending from one surface and an opposite surface of the transparent containing unit as described above, it is possible to form the optical communication module whose shape becomes asymmetry with respect to said one surface and the opposite surface, by configuring a staggered arrangement of the plural conductive plates between said one surface and the opposite surface. Therefore, it is possible to prevent a trouble caused by mounting the optical communication module in a wrong direction on a circuit board of a communication apparatus.

According to an aspect of the present invention, the transparent containing unit, the conductive plates and the like are accommodated in the housing while the plural conductive plates extending from the transparent containing unit are bent at the portions outside two coupled-fixing members. Since the conductive plates extending from the transparent containing unit can be bent as appropriate, it is relatively free to decide the size, the shape and the like of the housing. Thus, it is possible to utilize a relatively smaller housing that accommodates the transparent containing unit, the conductive plate and the like. Furthermore, the extending end of the conductive plate can be utilized as the connection terminal that is utilized for mounting the optical communication module on a circuit board of a communication apparatus, by exposing the extending end outside the housing.

In the present invention, when the plural conductive plates are configured to extend from the transparent containing unit containing the photoelectric conversion device and the electrical circuit component is configured to be connected to the extending conductive plate, it is possible to implement the package mounting the electrical circuit component required for the peripheral circuit, but without requiring the circuit board. In addition, when the coupled-fixing members are arranged at two positions in the extending direction, each of which couples and fixes the plural conductive plates in the direction perpendicular to the extending direction with nonconductive material and the electrical circuit component is arranged at a position between two coupled-fixing members, it is possible to prevent the stress on the portion connecting the electrical circuit component between two coupled-fixing members and the conductive plate. Hence, the conductive plate extending from the transparent containing unit can be bent at a portion outside two coupled-fixing members. For example, the conductive plate can be bent along the exterior of the transparent containing unit. Therefore, it is possible to reduce the size of the housing and the size of the optical communication module, even in the case that the transparent containing unit, the conductive plate and the like are accommodated in the housing.

As described above, the optical communication module according to the present invention can package plural electrical circuit components configuring a peripheral circuit together with the photoelectric conversion device, and can implement the miniaturization and the cost effective.

The above and further objects and features of the invention will more fully be apparent from the following detailed description with accompanying drawings.

BRIEF DESCRIPTION OF THE DRAWINGS

FIG. 4 is a schematic view showing a detailed inner component of the optical communication module according to the present invention.

DESCRIPTION OF THE PREFERRED EMBODIMENTS

Figure 1:
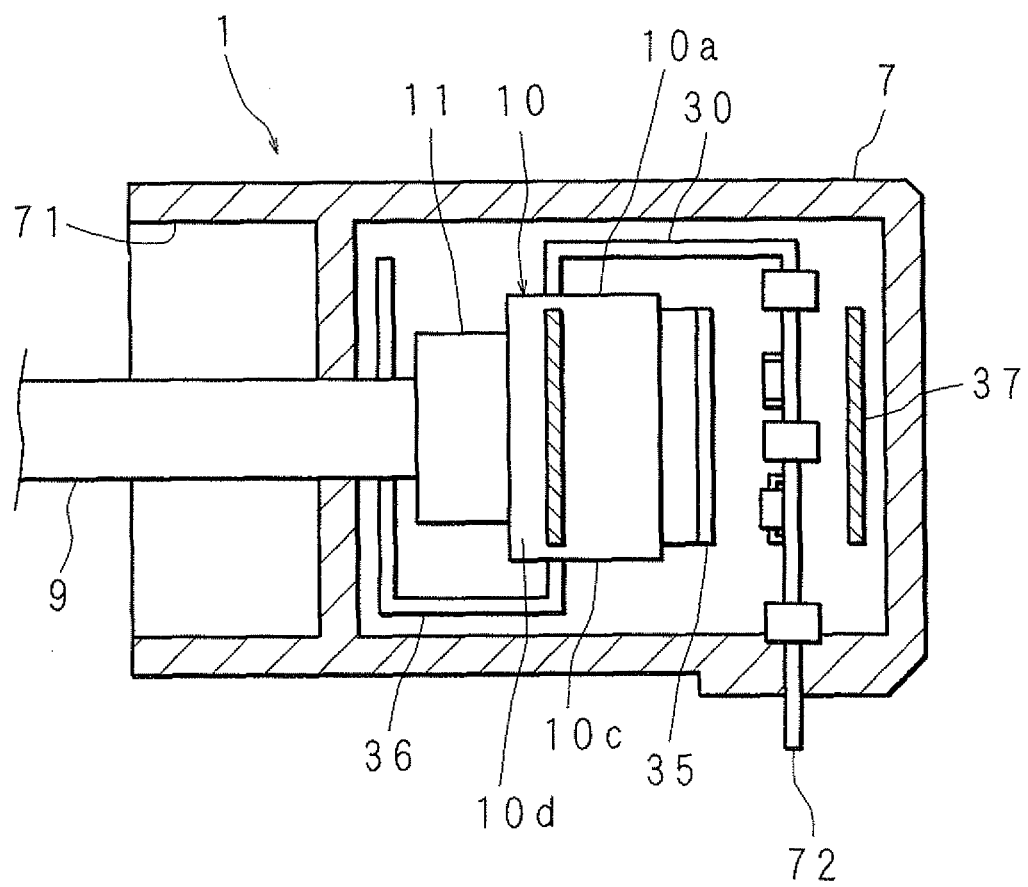
FIG. 1 is a schematic cross section view showing a configuration of an optical communication module according to the present invention.
Figure 2:
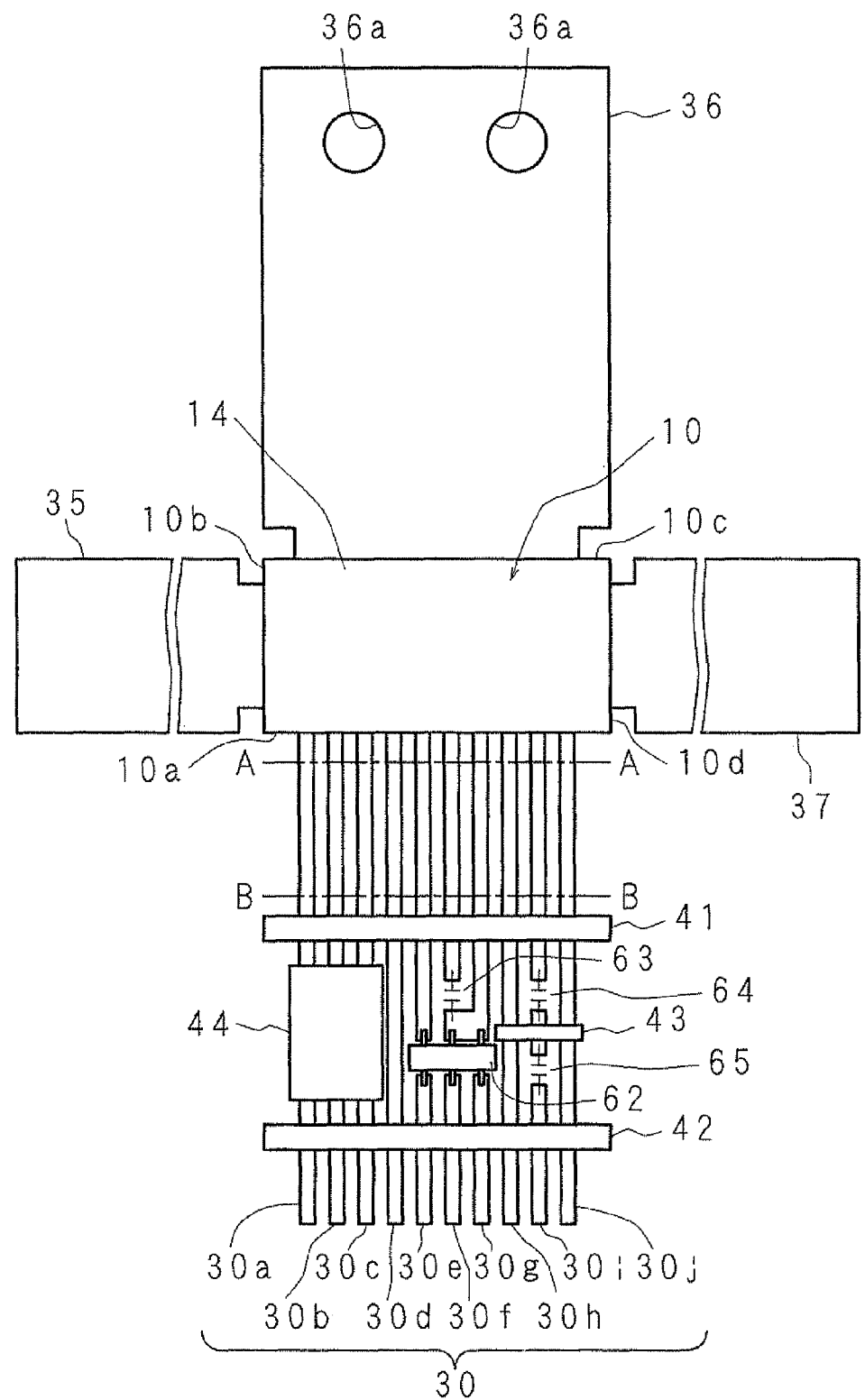
FIG. 2 is a schematic flat view showing a configuration of the optical communication module according to the present invention.
Figure 3:
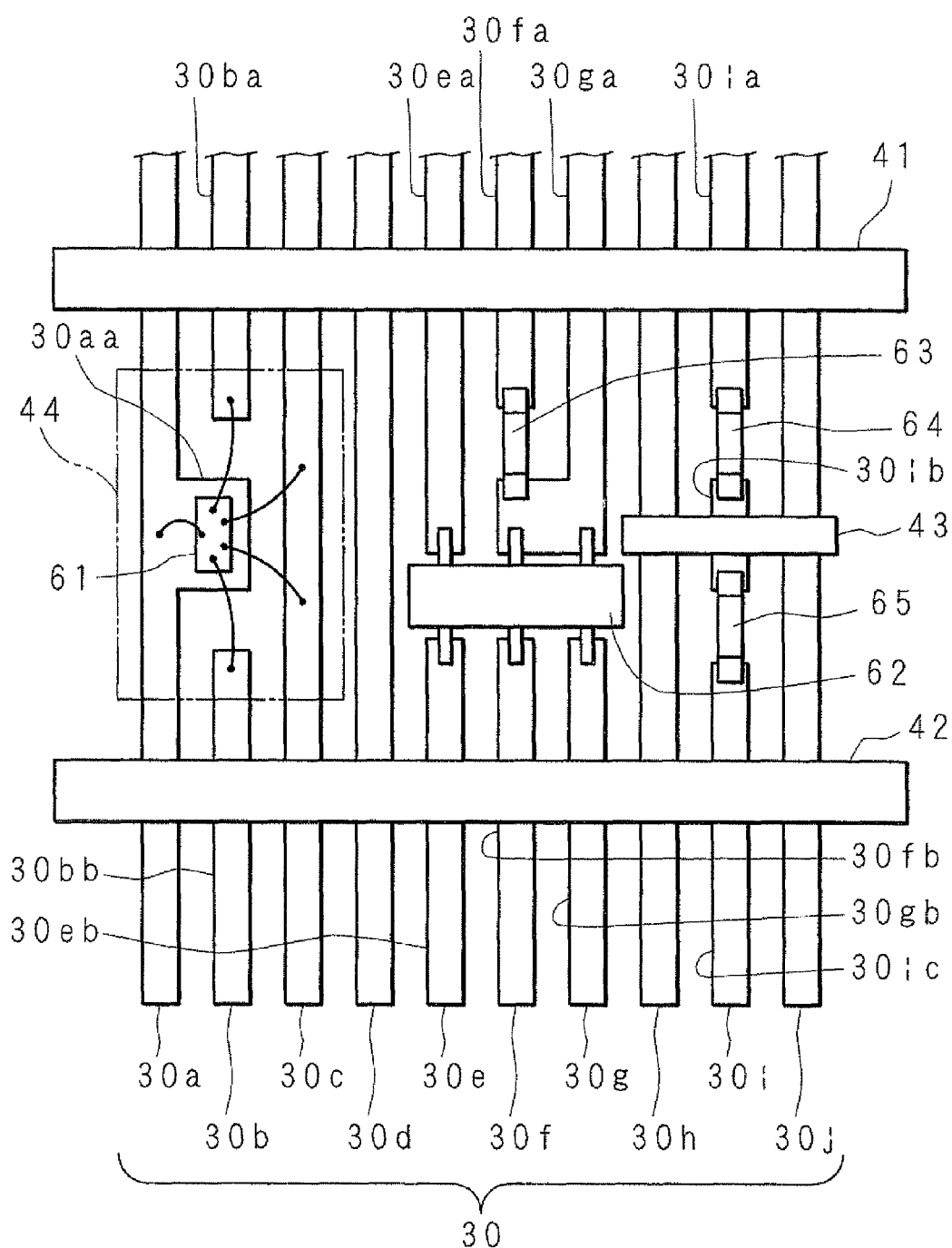
FIG. 3 is an enlarged view showing a portion of FIG. 2.

The present invention will be described in reference to figures that show Embodiments according to the present invention. FIG. 1 is a schematic cross section view showing a configuration of an optical communication module according to the present invention. FIG. 2 is a schematic flat view showing a configuration of the optical communication module according to the present invention. FIG. 3 is an enlarged view showing a portion of FIG. 2. FIG. 4 is a schematic view showing a detailed inner component of the optical communication module according to the present invention.

The numeral "1" in figures represents an OSA, corresponding to the optical communication module according to the present invention, which contains one or more photoelectric conversion devices, such as a photodiode 20 and/or a laser diode 50, and includes a function of converting an optical signal received from another apparatus through an optical fiber 9 into an electrical signal and outputting the converted electrical signal, and/or a function of converting an input electrical signal into an optical signal and transmitting the converted optical signal to another apparatus through the optical fiber 9. The OSA 1 includes a housing 7 formed in a substantial rectangular parallelepiped shape, and includes a photoelectric conversion device and a circuit component configuring a peripheral circuit which are accommodated in the housing 7. An opening portion 71 is formed on one surface of the housing 7, which is for inserting the optical fiber 9. A terminal 72 is formed on another surface perpendicular to said one surface of the housing 7, which is for connecting the OSA 1 to a circuit board of a communication apparatus or the like.

The OSA 1 includes a transparent containing unit 10 in the housing 7, as the transparent containing unit 10 is made of transparent synthetic resin and includes one or more photoelectric conversion devices. The transparent containing unit 10 of the OSA 1 in this embodiment includes two photoelectric conversion devices, i.e., the photodiode 20 and the laser diode 50, and can perform transmission of optical signals. The transparent containing unit 10 is formed in a substantial rectangular parallelepiped shape. Two cylindrical portions 11 are arranged to protrude from one surface (hereinafter, "front surface") of the transparent containing unit 10, which are utilized for connecting two optical fibers 9, respectively. The cylindrical portion 11 is formed in a substantial cylindrical shape, and can connect to the optical fiber 9 inserted into the opening portion 71 of the housing 7 by fitting the optical fiber 9 into the cylindrical portion 11.

A cover 14 is fixed on a back surface (opposite to the front surface where the cylindrical portion 11 is arranged) of the transparent containing unit 10, which is made of non-transparent synthetic resin. As a recess portion 12*a* is formed in the transparent containing unit 10, the photodiode 20 and the laser diode 50 arranged in the recess portion 12*a* are sealed by a cover 14 sealing the recess portion 12*a*.

In addition, conductive plates 30, 35-37 are respectively arranged to extend externally from four surfaces (side surfaces 10*a*-10*d*), that are different from the front surface and the back surface of the transparency maintaining unit 10. Plural elongated conductive plates 30 are arranged to extend from the first side surface 10*a* of the transparent containing unit 10, and an extending end of each conductive plate 30 works as a terminal 72 exposed outside the housing 7. One of rectangular conductive plates 35-37 is arranged to extend from each of second to fourth side surfaces 10*b*-10*d*. The OSA 1 keeps the conductive plates 30, 35-37 of the transparent containing unit 10 that are bent as appropriate in the housing 7.

As extending from the first side surface 10*a* of transparent containing unit 10, the conductive plate 30 consists of ten conductive plates 30*a*-30*j* in this embodiment. Ten conductive plates 30*a*-30*j* are formed in elongated shapes having similar widths to each other, are evenly spaced from each other, and extend substantially parallel to each other from the first side surface 10*a* of the transparent containing unit 10. One end of each of the conductive plates 30*a*-30*j* is properly connected to the photodiode 20 or the laser diode 50 (or one of conductive plates 35-37 extending from the other side surfaces 10*b*-10*d*) in the transparent containing unit 10, and the other end is exposed from the housing 7 and, for example, connected to a circuit board of a communication apparatus.

The OSA 1 includes two coupled-fixing members 41, 42 for coupling and fixing a bundle of ten conductive plates 30*a*-30*j* with non-conductive synthetic resin. Each of coupled-fixing members 41, 42 is formed in an elongated rectangular parallelepiped shape, and arranged substantially perpendicular to ten conductive plates 30*a*-30*j* that extend substantially parallel to each other. Each of the coupled-fixing members 41, 42 is formed by resin molding method with non-conductive synthetic resin, to bury a portion of the conductive plates 30*a*-30*j*. In addition, two coupled-fixing members 41, 42 are spaced away by a predetermined distance, and arranged substantially parallel to each other at two positions in the extending direction on the conductive plates 30*a*-30*j*.

Plural electrical circuit components, such as an IC chip 61, an IC package 62, and capacitors 63-65, are connected to the conductive plates 30*a*-30*j* of the OSA 1 at an area between the coupled-fixing members 41, 42. These electrical circuit components are utilized for configuring a peripheral circuit regarding the performances of the photodiode 20 and the laser diode 50 contained in the transparent containing unit 10. Thus, the conductive plates 30*a*-30*j* correspond to wires for connecting electrical circuit components. Based on the peripheral circuit to be configured, the conductive plates 30*a*-30*j* are cut properly in the longitudinal direction to generate plural cut conductive plate portions, and are provided with tongue portions extending in a direction perpendicular to the longitudinal direction.

For example, the conductive plate 30*a* is provided with a tongue portion 30*aa* at a substantial center position between the coupled-fixing members 41, 42, as the tongue portion 30*aa* is extending toward the adjacent conductive plate 30*b*. The conductive plate 30*b* is cut into two conductive plate portions 30*ba*, 30*bb* extending in the longitudinal direction, and the tongue portion 30*aa* of the conductive plate 30*a* is arranged between these conductive plate portions 30*ba*, 30*bb*. The IC chip 61 is fixed to the tongue portion 30*aa* of the conductive plate 30*a* by adhesive and the like. The IC chip 61 is provided on the upper surface with a terminal for inputting an electrical signal, and the lower surface of the IC chip 61 is connected to the conductive plate 30*a*. The terminal on the upper surface is connected to the conductive plates 30*a*-30*c* through the wire. In addition, the IC chip 61 and the conductive plates 30*a*-30*c* around the IC chip 61 are sealed by synthetic resin (sealing unit 44).

For example, the conductive plate 30*e* is cut at the substantial center between the coupled-fixing members 41, 42 to generate two conductive plate portions 30*ea*, 30*eb*, the conductive plate 30*f* is cut to generate conductive plate portions 30*fa*, 30*fb*, and the conductive plate 30*g* is cut to generate conductive plate portions 30ga, 30gb. The conductive plate portion 30ga is formed in a substantial "L" shape, and an end of the conductive plate portion 30ga is arranged between the conductive plate portions 30fa, 30fb. The IC package 62 and the capacitor 63 are connected to the conductive plates 30e-30g. A main body of the IC package 62 is formed in a substantial rectangular parallelepiped shape, and three terminals are provided on each of both side surfaces of the main body. Each of four terminals among the total six terminals is connected to one of the conductive plate portions 30ea, 30eb, 30fa, 30gb, and the remaining two terminals are connected to the conductive plate portion 30ga. The capacitor 63 has two terminals connected to the conductive plate portions 30fa, 30ga.

The conductive plate 30i is cut at two sites between the coupled-fixing members 41, 42 to generate three conductive plate portions 30ia, 30ib, 30ic. The conductive plate portion 30ia can be fixed to the coupled-fixing member 41, and the conductive plate portion 30ic can be fixed to the coupled-fixing member 42. However, the conductive plate portion 30ib cannot be fixed to the coupled-fixing members 41, 42. Thus, the conductive plate portion 30ib will be a floating-point portion. The OSA 1 according to the present invention further includes a floating-point fixing member 43 for connecting and fixing the conductive plate portion 30ib (i.e., the floating-point portion) to the adjacent conductive plates 30h, 30j. Similarly to the coupled-fixing members 41, 42, the floating-point fixing member 43 is arranged substantially perpendicular to the conductive plates 30h-30j, and is made of non-conductive synthetic resin to bury a portion of the conductive plate portion 30ib and conductive plates 30h, 30j. The capacitor 64 is connected between the conductive plate portions 30ia, 30ib, and the capacitor 65 is connected between the conductive plate portions 30ib, 30ic. Therefore, it is possible to implement the circuit on the conductive plate 30i in which two capacitors 64, 65 are serially connected.

When the electrical circuit components, such as the IC chip 61, the IC package 62 and the capacitors 63-65, are mounted on the plural conductive plates 30a-30j extending from the transparent containing unit 10 of the OSA 1 as described above, it is possible to implement mounting on the OSA 1 not only of the photodiode 20 and the laser diode 50 but also of the peripheral circuit regarding the performances of the photodiode 20 and the laser diode 50. The OSA 1 is illustrated to include the housing 7 in which the conductive plate 30 extending from transparent containing unit 10 is bent and accommodated, as described above. For example, it may be configured to bend the conductive plate 30 at the portions outside two coupled-fixing members 41, 42 (e.g., a line AA and a line BB represented by dashed lines in FIG. 2). In that configuration, it is possible to prevent the stress caused on the portion connecting the electrical circuit components and the conductive plate 30 between the coupled-fixing members 41, 42.

The conductive plate 35 extending from the second side surface 10b of the transparent containing unit 10 is a single plate formed in a substantial rectangular shape. The conductive plate 35 is bent toward the back surface side along the side surface 10b of the transparent containing unit 10, and further bent to cover the back surface provided with the cover 14 of the transparent containing unit 10. Thus, the length of the conductive plate 35 in the extending direction is decided to be enough for covering the second side surface 10b and the back surface of the transparent containing unit 10. In addition, the conductive plate 35 is electrically connected to any one of the conductive plate 30a-30j in the transparent containing unit 10, and is indirectly connected to a fixed potential, such as a ground potential. Therefore, the conductive plate 35 can be utilized as the shield board that shields the photodiode 20 and the laser diode 50 contained in the transparent containing unit 10 from the external electromagnetic noises.

The plural conductive plates 30a-30j extending from the first side surface 10a of the transparent containing unit 10 are bent on the line AA of FIG. 2 along the side surface 10a toward the back surface side, and further bent on the line BB of FIG. 2 toward the back surface side of the conductive plate 35 that covers the back surface of the transparent containing unit 10.

The conductive plate 36 extending from the third side surface 10c of the transparent containing unit 10 is a single plate formed in a substantial rectangular shape, and provided with two through holes 36a, each of which is formed in a substantial circular shape. The conductive plate 36 is bent along the side surface 10c of the transparent containing unit 10 toward the front surface side, and further bent to cover protruding ends of two cylindrical portions 11 arranged on the front surface of the transparent containing unit 10. Because two through holes 36a are formed on the conductive plate 36, the optical fibers 9 can be fit into the cylindrical portion 11 through the through holes 36a. In addition, the conductive plate 36 is electrically connected to any one of the conductive plates 30a-30j in the transparent containing unit 10, and is indirectly connected to a fixed potential, such as the ground potential. Therefore, the conductive plate 36 can be utilized as the shield board shielding against the electromagnetic noises.

The conductive plate 37 extending from the fourth side surface 10d of the transparent containing unit 10 is a single plate formed in a substantial rectangular shape, similar to the shape of the conductive plate 35. The conductive plate 37 is bent along the side surface 10d of the transparent containing unit 10 toward the back surface side, and further bent to cover the conductive plates 30a-30j that are bent toward the back surface side of the transparent containing unit 10. Therefore, the length of the conductive plate 37 in the extending direction is longer than the conductive plate 35. In addition, the conductive plate 37 is electrically connected to any one of the conductive plates 30a-30j in the transparent containing unit 10, and is indirectly connected to a fixed potential, such as the ground potential. Therefore, the conductive plate 37 can be utilized as the shield board shielding against the electromagnetic noises.

When the conductive plates 35-37 extending from the transparent containing unit 10 are utilized as the shield board and the housing 7 accommodates the conductive plates 35-37 that is bent and covers the transparent containing unit 10 as described above, it is possible to protect the photodiode 20 and the laser diode 50 contained in the transparent containing unit 10 from the electromagnetic noises. Furthermore, when the conductive plates 30a-30j mounting plural electrical circuit components are arranged between the conductive plates 35, 37, it is possible to protect the electrical circuit components from the electromagnetic noises.

Next, it will be described about an inner configuration of the transparent containing unit 10. The transparent containing unit 10 of the OSA 1 includes a peripheral wall 12 arranged to protrude from a peripheral portion on the back surface of the platy base formed in the substantial rectangular shape, as the peripheral wall 12 is formed in substantial rectangular-cylindrical shape. A space surrounded by the base and the peripheral wall 12 is utilized as the recess portion 12a for accommodating the photodiode 20 and the laser diode 50. In the transparent containing unit 10, the cover 14 is connected to the protruding end of the peripheral wall 12 by an ultrasonic bonding method or an adhesive bonding method. The cover 14 is formed in a substantial rectangular shape similarly to the base of the transparent containing unit 10. The recess portion 12a is partitioned into the inside area and the outside area by the cover 14 connected to the peripheral wall 12. Gas, such as nitrogen gas or dry air, may be injected into the inside area of the recess portion 12a when the cover 14 is connected. Alternatively, it may be configured that the inside area of the recess portion 12a is evacuated.

The conductive plate 30 extending from the first side surface 10a of the transparency maintaining unit 10 is buried into the transparent containing unit 10, and one surface of the conductive plate 30 is exposed at the bottom portion of the recess portion 12a. The photodiode 20 and the laser diode 50 are appropriately connected to the exposed portion of the conductive plate 30 in the recess portion 12a. Thus, it is possible to transmit an electrical signal through the conductive plate 30 between the photodiode 20, the laser diode 50 and the electrical circuit components mounted on the outside of the transparent containing unit 10. Therefore, it is possible to transmit an electrical signal between the photodiode 20, the laser diode 50 and the circuit board of the communication apparatus mounted on the OSA 1.

Figure 5A:
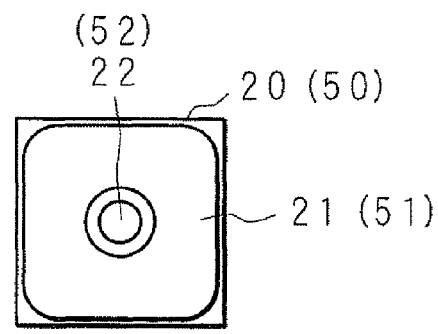
FIG. 5A is a schematic view showing an example configuration of a photoelectric conversion device included in the optical communication module according to the present invention.
Figure 5B:
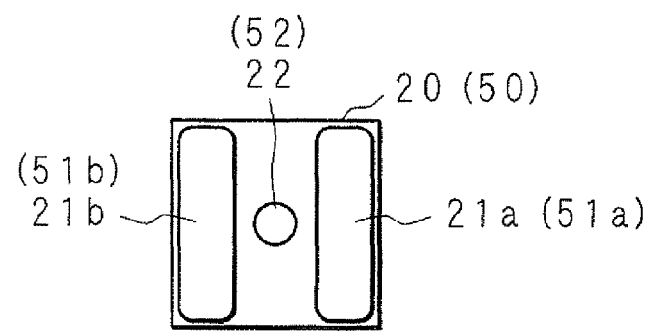
FIG. 5B is a schematic view showing another example configuration of the photoelectric conversion device included in the optical communication module according to the present invention.
Figure 5C:
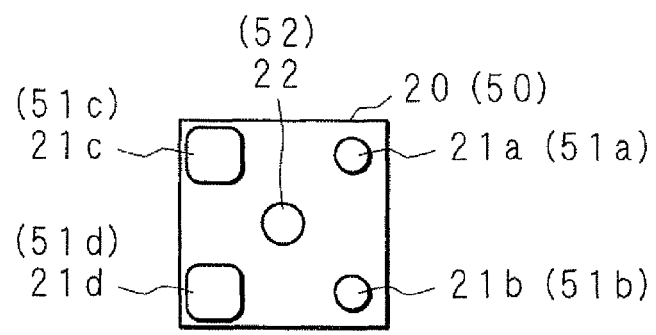
FIG. 5C is a schematic view showing another example configuration of the photoelectric conversion device included in the optical communication module according to the present invention.

FIG. 5A to FIG. 5C are schematic views showing example configurations of the photoelectric conversion device included in the optical communication module according to the present invention. FIG. 5A to FIG. 5C show three example configurations viewed from the front surface side of the photodiode 20 and the laser diode 50. Each component for the laser diode 50 is represented by the number within parenthesis in FIG. 5A to FIG. 5C, because the configuration of the photodiode 20 is similar to the configuration of the laser diode 50.

The photodiode 20 (laser diode 50) in a plain view is formed in a substantial square plate shape, is provided at the substantial center on the front surface with an optical receiver 22 for detecting light and converting into an electrical signal (light emitting unit 52 for emitting light in response to an electrical signal), and is provided around the optical receiver 22 (light emitting unit 52) with one or more connectors 21 (51). The connector 21 (51) is a terminal for inputting and outputting an electrical signal of the photodiode 20 (laser diode 50), and for connecting the photodiode 20 (laser diode 50) to the conductive plate 30 by soft solder, conductive adhesive or the like.

For example, it may be configured that the connector 21 (51) is formed in an annular shape that surrounds the optical receiver 22 (light emitting unit 52) (see FIG. 5A). As only one connector 21 (51) can be arranged on the front surface of the photodiode 20 (laser diode 50) in that configuration, one more connector must be arranged on the back surface or the side surface because the photodiode 20 (laser diode 50) requires two terminals for inputting and outputting. In this embodiment, another connector (not shown) is arranged on the back surface of the photodiode 20 (laser diode 50), and the connector on the back surface is electrically connected to the conductive plate 30 by a wire 32.

Alternatively, it may be configured that two connectors 21a, 21b (51a, 51b) are arranged on the front surface of the photodiode 20 (laser diode 50) (see FIG. 5B). In that configuration, each connector 21a, 21b (51a, 51b) may be formed in a substantial rectangular shape and arranged to sandwich the optical receiver 22 (light emitting unit 52). Alternatively, it may be configured that dummy connectors 21c, 21d (51c, 51d) are also provided in addition to the connectors 21a, 21b (51a, 51b) utilized for inputting and outputting, as the dummy connectors 21c, 21d (51c, 51d) are utilized for connecting by soft solder or conductive adhesive but do not input and output an electrical signal (see FIG. 5C). In that configuration, four connectors 21a-21d (51a-51d) can be arranged at the four corners on the front surface of the photodiode 20 (laser diode 50).

This embodiment is illustrated to include the OSA 1 provided, with the photodiode 20 and the laser diode 50 shown in FIG. 5A.

The connectors 21, 51 of the photodiode 20 and the laser diode 50 are connected to the exposed portion of the conductive plate 30 in the recess portion 12a of the transparent containing unit 10 by soft solder or conductive adhesive, and the terminals arranged on, for example, the back surface of the photodiode 20 and the laser diode 50 are connected to the conductive plate 30 by the wire 32 (although the conductive plate 30 consists of plural conductive plates 30a-30j, the photodiode 20 and the laser diode 50 are connected any of conductive plates 30a-30j for configuring proper electrical circuits in cooperation with the electrical circuit components). In addition, an opening portion 31 is formed on a portion of the conductive plate 30 connected to the photodiode 20 or the laser diode 50, as the opening portion 31 is formed in a substantial circular shape for passing light coming to the optical receiver 21 or from the light emitting unit 51. Therefore, the photodiode 20 and the laser diode 50 can receive and transmit optical signals through the opening portion 31 of the conductive plate 30.

The transparent containing unit 10 is made of transparent synthetic resin by an integral molding method. For example, so-called injection molding method can be utilized as the integral molding method, in which the conductive plates 30, 35-35 previously manufactured to be in predetermined shapes are arranged in a die and clear liquid resin is poured into the die and is cured. When the transparent containing unit 10 is made of transparent synthetic resin, the photodiode 20 and the laser diode 50 connected to the conductive plate 30 can perform transmission of optical signals with the outside through the transparent containing unit 10 and the opening portion 31 of the conductive plate 30 (in other words, the whole of transparent containing unit 10 is a transparent portion for passing light). In addition, because the synthetic resin configuring the transparent containing unit 10 can be selected regardless of heat resistance provided to the photodiode 20 and the laser diode 50, it is possible to select the synthetic resin that has a higher forming precision and is harder to deform in response to ambient environment, such as temperature change.

The transparent containing unit 10 is provided with two convex lenses 15, 16 on the front surface. The lenses 15, 16 are made of synthetic resin together with the transparent containing unit 10 by the integral molding method. The lenses 15, 16 are arranged on the front surface of the transparent containing unit 10, and the center of each arranged lenses 15, 16 matches the center of opening portion 31 of the conductive plate 30 buried in the transparent containing unit 10. Therefore, the lens 15 can collect light emitted from the optical fiber 9 and focus the collected light into the optical receiver 21 of the photodiode 20 through the transparent containing unit 10 and the opening portion 31, and the lens 16 can collect the light emitted from the light emitting unit 51 of the laser diode 50 and focus the collected light into the optical fiber 9 through the opening portion 31 and the transparent containing unit 10.

A positioning unit 13 is arranged to protrude at the substantial center of the bottom portion in the recess portion 12a of the transparent containing unit 10, which is formed in a round bar shape. The positioning unit 13 is utilized as a reference point for deciding positions of the photodiode 20 and the laser diode 50 connected to the conductive plate 30 in the recess portion 12a, and thus the distances from the reference point to the center of lens 15 and to the center of lens 16 are precisely set. The positioning unit 13 is formed integrally with the transparent containing unit 10.

In addition, the OSA 1 includes two cylindrical portions 11 arranged to protrude from the front surface of the transparent containing unit 10, as each cylindrical portion 11 is formed in a cylindrical shape. The cylindrical portions 11 is formed independently from the transparent containing unit 10, and connected to the front surface of the transparent containing unit 10 to surround the lens 15 or the lens 16. The inner diameter of the cylindrical portion 11 is longer at the front surface side, but the inner diameter of the cylindrical portion 11 is shorter at the back surface side, because the inner diameter of the cylindrical portion 11 is lengthened stepwisely toward the front surface side. At the back surface side, the shorter inner diameter of the cylindrical portion 11 is as short as, or a little longer than the diameter of lens 15 or lens 16. At the front surface side, the longer inner diameter of the cylindrical portion 11 is as long as the diameter of the optical fiber 9.

Plural connection pins are arranged to stand on an end surface at the back surface side of the cylindrical portion 11, as each connection pin is formed in a substantial round bar shape. Plural connection pins are spaced away from each other by a predetermined distance in a circumferential direction of the end surface of the cylindrical portion 11. Plural connection holes 17 are arranged around the lens 15 and the lens 16 on the front surface of the transparent containing unit 10, which are utilized for connecting the cylindrical portion 11 and to which connection pins are inserted. Positions for locating the connection pin of the cylindrical portion 11 and the connection hole 17 of the transparent containing unit 10 are precisely determined, to make the center of cylindrical portion 11 match the center of lens 15 or the lens 16 after the connection pin is inserted into the connection hole 17 and thus the cylindrical portion 11 is connected to the transparent containing unit 10. The cylindrical portion 11 may be made of synthetic resin, or the other material, such as metal or wood. The connection pin may be only inserted into the connection hole 17 of the transparent containing unit 10 for the connection of the cylindrical portion 11. Alternatively, the connection pin may be inserted into and further fixed by adhesive or the like to the connection hole 17. This alternative configuration may lead stronger connection.

The positions for locating the connection pin of cylindrical portion 11 and the connection hole 17 of the transparent containing unit 10 are precisely determined, for matching the center of each cylindrical portion 11 with the center of the lens 15 or the lens 16 after the connection pin is inserted into the connection hole 17 and thus two cylindrical portions 11 are connected to the front surface of the transparent containing unit 10. Furthermore, the shape of the cylindrical portion 11 is also precisely formed, for matching the center of cylindrical portion 11 with the center of optical fiber 9 after the optical fiber 9 is fit to the cylindrical portion 11. Therefore, it is possible to match the centers of the lens 15 and the lens 16 with the centers of two optical fibers 9 fit to the cylindrical portions 11, respectively.

Because the photodiode 20 is connected to the conductive plate 30 while the center of the optical receiver 22 in the photodiode 20 matches the center of lens 15, it is possible to match the center of optical receiver 22 in the photodiode 20, the center of the lens 15 and the center of the optical fiber 9 utilized for receiving, and to make the lens 15 collect light emitted from the optical fiber 9 and precisely focus the collected light to the optical receiver 22 of the photodiode 20. In addition, because the laser diode 50 is similarly connected to the conductive plate 30 while the center of the light emitting unit 52 in the laser diode 50 matches the center of the lens 16, it is possible to match the center of the light emitting unit 52 in the laser diode 50, the center of lens 16 and the center of optical fiber 9 utilized for transmitting, and to make the lens 16 collect light emitted from the light emitting unit 52 of the laser diode 50 and precisely focus the collected light to the optical fiber 9.

When it is configured in the OSA 1 that plural conductive plates 30a-30j extend from the transparent containing unit 10 containing the photodiode 20 and the laser diode 50 and electrical circuit components, such as the IC chip 61, the IC package 62 and the capacitors 63-65, are connected to the extending conductive plates 30a-30j as described above, it is possible to utilize the conductive plates 30a-30j as the wiring, for configuring the electrical circuits. Therefore, the circuit board is not required for mounting peripheral circuits together with the photoelectric conversion device on the OSA 1. In addition, when the conductive plates 30a-30j extending from the transparent containing unit 10 are bent and then accommodated in the housing 7, it is possible to reduce the size of the housing 7 and thus to reduce the size of the OSA 1.

In addition, it is configured that the conductive plates 30a-30j extending from the transparent containing unit 10 are coupled in a direction crossing (perpendicular to) the extending direction at two portions in the extending direction by the coupled-fixing members 41, 42 made of non-conductive synthetic resin, electrical circuit components are arranged between two coupled-fixing members 41, 42, and the conductive plates 30a-30j are bent at the portions outside the two coupled-fixing members 41, 42. Thus, it is possible to prevent the stress caused by bending on the portion connecting the electrical circuit components between two coupled-fixing members 41, 42 to the conductive plates 30a-30j. Therefore, it is possible to prevent the connection fault of the electrical circuit component, even when the conductive plates 30a-30j are bent and accommodated into smaller housing 7 for reducing the size of the OSA 1.

In the case that the conductive plates 30a-30j extending from the transparent containing unit 10 must be cut to generate the floating point portion for configuring a peripheral circuit, it is possible to facilitate implementing the floating point portion and enhance the design freedom of the electrical circuit mounted on the OSA 1, by providing with the floating-point fixing member 43 that couples and fixes the floating point portion to an adjacent conductive plate.

In the case that the IC chip 61 is mounted on and connected by a wire to the conductive plate conductive plates 30a-30j extending from the transparent containing unit 10, it is possible to mount, with sufficient connection strength, not only the IC chip packaged in the OSA 1 but also the IC chip 61 not packaged in the OSA 1, by providing the sealing unit 44 that seals with resin the IC chip 61, the wire and the conductive plates 30a-30j around these components.

In addition, when the conductive plates 35-37 extending from the other side surfaces of the transparent containing unit 10 are bent along the side surface to surround the transparent containing unit 10 and thus electrically connected to a fixed potential, such as the ground potential, the conductive plates 35-37 can be utilized as the shield board for shielding against electromagnetic noises. Therefore, it is possible to prevent the communication accuracy of the OSA 1 from being reduced, because the performance of the photoelectric conversion device in the transparent containing unit 10 can be protected from the electromagnetic noises. In addition, when the through hole 36a is formed on the conductive plate 36 covering the front surface of the transparent containing unit 10, the optical fiber 9 can be fit through the through hole 36a to the cylindrical portion 11 arranged on the front surface of the transparent containing unit 10.

Although this embodiment is illustrated to include two photoelectric conversion devices, i.e., the photodiode 20 and the laser diode 50, the present invention is not limited to the illustration. Alternatively, it may be configured to include any one of the photodiode 20 and the laser diode 50, or more than two photoelectric conversion devices. In addition, although this embodiment is illustrated to include two cylindrical portions on the front surface of the transparent containing unit 10, the present invention is not limited to the illustration. Alternatively, it may be configured to include a component in which two cylindrical portions 11 are integrated, or the cylindrical portion 11 may be formed integrally with the transparent containing unit 10.

Although this embodiment is illustrated to include ten conductive plates 30a-30j extending from the side surface 10a of the transparent containing unit 10, the present invention is not limited to the illustration. Alternatively, it may be configured to extend conductive plates less than ten, or more than ten. In addition, although FIG. 2 and FIG. 3 show examples of the connection for the electrical circuit components, the present invention is not limited to these examples. Various electrical circuit components can be connected to the conductive plate 30 to configure various electrical circuits. Although this embodiment is illustrated to include the conductive plates 35-37 extending from the side surfaces 10b-10d of the transparent containing unit 10 which are utilized as the shield board, the present invention is not limited to the illustration. Alternatively, the OSA 1 may include no conductive plates 35-37.

Although this embodiment is illustrated to include the photodiode 20 and the laser diode 50 whose optical reviver 22 and light emitting unit 52 are arranged on the surface having the arranged connectors 21, 51, the present invention is not limited to the illustration. Alternatively, it may be configured that the optical receiver 22 and the light emitting unit 52 are arranged on a surface opposite to the surface having the arranged connectors 21, 51. In that alternative configuration, it is possible to arrange the lens 15, the lens 16, the cylindrical portion 11 and the like on the cover 14. In addition, although this embodiment is illustrated to accommodate the photoelectric conversion device in the recess portion 12a of the transparent containing unit 10 and to seal the photoelectric conversion device by attaching the cover 14, the present invention is not limited to the illustration. Alternatively, it may be configured to utilize transparent synthetic resin to seal the photoelectric conversion device together with the conductive plate 30 and form the lens 15 and the lens 16 by the integral molding method. Alternatively, it may be configured to accommodate the photoelectric conversion device in the recess portion 12a and to fill synthetic resin in the recess portion 12a for sealing with resin.

Alternate Embodiment

Figure 6:
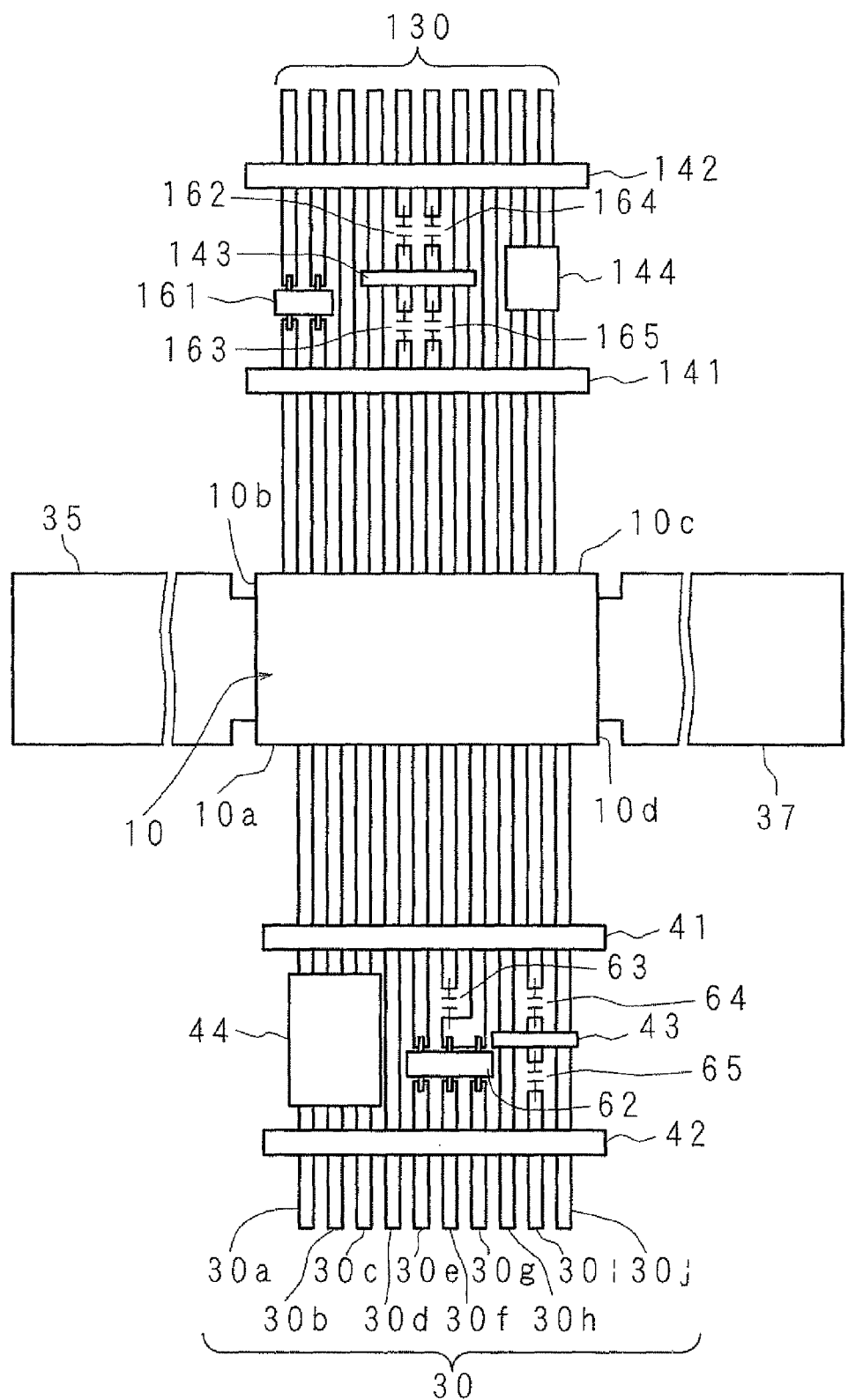
FIG. 6 is a schematic flat view showing a configuration of the optical communication module according to an alternate embodiment of the present invention.

FIG. 6 is a schematic flat view showing a configuration of the optical communication module according to an alternate embodiment of the present invention. The OSA 1 in the above embodiment is illustrated to include ten conductive plates 30 (30a-30j) extending only from the first side surface 10a of the transparent containing unit 10 for mounting the electrical circuit components. On the other hand, the OSA 1 in this alternate embodiment further includes ten conductive plates 130 extending from the third side surface 10c for mounting electrical circuit components 161-165, i.e., the side surface opposite to the first side surface 10a of the transparent containing unit 10, too.

Two coupled-fixing members 141, 142 are provided to the conductive plate 130 extending from the third side surface 10c, similarly to the conductive plate 30 extending from the first side surface 10a. The coupled-fixing members 141, 142 are arranged substantially perpendicular to the extending direction. Each of the coupled-fixing members 141, 142 is made of non-conductive synthetic resin by the resin molding method to bury a part of the conductive plate 130. In addition, the coupled-fixing members 141, 142 are spaced away from each other by a predetermined distance, and are arranged in substantially parallel to each other at two locations in the extending direction of the conductive plate 130.

The conductive plate 130 is appropriately connected to the sealing unit 144 sealing the IC chip, and the electrical circuit components, such as the IC package 161 and the capacitors 162-165, which are arranged between two coupled-fixing members 141, 142. The capacitors 162, 163 are serially connected on the conductive plate 130, and the capacitors 164, 165 are also serially connected on the conductive plate 130. Thus, the conductive plate 130 is cut at points between the capacitors 162, 163 and between the capacitors 164, 165. Hence, the floating point portion is generated between the capacitors 162, 163, and the floating point portion is generated between the capacitors 164, 165, too. Therefore, the OSA 1 includes a floating-point fixing member 143 for connecting and fixing two floating point portion with the neighboring conductive plates 130. The floating-point fixing member 143 is made of non-conductive synthetic resin to bury a part of the floating point portion and a part of the neighboring conductive plates 130.

The total of twenty conductive plates 30, 130 extending from the both side surfaces (side surfaces 10a, 10c) of the transparent containing unit 10 are arranged to interleave each extending position of the conductive plate 30 and each extending position of the conductive plate 130 in a plain view as shown in FIG. 6, i.e., the staggered arrangement is configured. For the staggered arrangement, ten conductive plates 30 are arranged on the first side surface 10a and spaced away by a predetermined distance from each other, and ten conductive plates 130 are arranged on the third side surface 10c and spaced away by the same predetermined distance. At that time, it may be configured that the conductive plate 30 extends from a predetermined position on the first side surface 10a, but the conductive plate 130 does not extend from a position on the third side surface 10c opposite to the predetermined position on the first side surface 10a. On the other hand, it may be configured that the conductive plate 130 extends from a given position on the third side surface 10c, but the conductive plate 30 does not extend from a position on the first side surface 10a opposite to the given position on the third side surface 10c.

When the plural conductive plates 30, 130 are configured to extend from two side surfaces 10a, 10c of the transparent containing unit 10, the OSA 1 of the alternate embodiment described above can mount a larger number of electrical circuit components. Therefore, it is possible to further enhance the design freedom of the electrical circuit mounted on the OSA 1. Although this alternate embodiment is illustrated to extend the conductive plates 30, 130 from two side surfaces 10a, 10c of the transparent containing unit 10 for mounting the electrical circuit components and to utilize the other conductive plates 35, 37 extending from the other side surfaces 10b, 10d as the shield board, the present invention is not limited to the illustration. Plural conductive plates may be configured to extend for mounting electrical circuit components from each of the other side surfaces 10b, 10d, too.

EXPLANATION OF ITEM NUMBERS

1 OSA (optical communication module)
7 housing
9 optical fiber
10 transparent containing unit
10a-10d side surface
11 cylindrical portion
12 peripheral wall
12a recess portion
13 positioning unit
14 cover
15, 16 lens
17 connection hole
20 photodiode (photoelectric conversion device)
21 connector
22 optical receiver
30, 30a-30j conductive plate
30ib conductive plate portions (floating point)
31 opening portion
32 wire
35-37 conductive plate (shield board)
36a through hole
41,42 coupled-fixing member
43 floating-point fixing member
44 sealing unit
50 laser diode (photoelectric conversion device)
51 connector
52 light emitting unit
61 IC chip (electrical circuit component)
62 IC package (electrical circuit component)
63-65 capacitor (electrical circuit component)
130 conductive plate
141, 142 coupled-fixing member
143 floating-point fixing member
144 sealing unit
161 IC package (electrical circuit component)
162-165 capacitor (electrical circuit component)

The invention claimed is:

1. An optical communication module that performs an optical communication, comprising:
a photoelectric conversion device that performs a photoelectric conversion;
a transparent containing unit that internally keeps the photoelectric conversion device and has a transparent portion which passes light;
a plurality of conductive plates that are connected to an external surface of the transparent containing unit;
plural coupled-fixing members that are arranged on the plurality of conductive plates; and
an electrical circuit component that is connected to a conductive plate among the plurality of conductive plates, wherein:
the photoelectric conversion device and the electrical circuit component are utilized to perform the optical communication,
the electrical circuit component is arranged between the plural coupled-fixing members, and
a longitudinal direction for at least one of the plural coupled-fixing members is not parallel to a longitudinal direction for the conductive plate.

2. An optical communication module according to claim 1, further comprising:
a housing that accommodates the transparent containing unit, the plurality of conductive plates and the electrical circuit component, wherein
the plurality of conductive plates is bent at an bending area on the conductive plate, and
the bending area excludes an area between the plural coupled-fixing members on the plurality of conductive plates.

3. An optical communication module according to claim 2, wherein
the conductive plate is separated at its own two portions into a first region, an intermediate floating-point region, and a second region, and
the optical communication module further comprises a floating-point fixing member that fixes the intermediate floating-point region to another conductive plate adjacent to the conductive plate among the plurality of conductive plates.

4. An optical communication module according to claim 3, wherein
the floating-point fixing member is made of non-conductive material.

5. An optical communication module according to claim 4, further comprising:
another conductive plate that is connected to another external surface of the transparent containing unit.

6. An optical communication module according to claim 5, wherein
said another conductive plate connected to said another external surface works as a shield board that shields from electromagnetic noises.

7. An optical communication module according to claim 5, wherein
said another conductive plate connected to said another external surface is provided with a through hole,
said another conductive plate connected to said another external surface is bent in the housing, and
a center of the through hole matches a center of the photoelectric conversion device.

8. An optical communication module according to claim 4, further comprising:
Another plurality of conductive plates that is connected to another external surface of the transparent containing unit, wherein
the external surface is opposite to said another external surface, and
a staggered arrangement is configured by the plurality of conductive plates and said another plurality of conductive plates.

9. An optical communication module according to claim 1, further comprising:
a sealing unit that seals the electrical circuit component with synthetic resin.

* * * * *